United States Patent
Majhi et al.

(10) Patent No.: US 12,058,847 B2
(45) Date of Patent: Aug. 6, 2024

(54) MONOLITHIC MEMORY STACK

(71) Applicant: Intel Corporation, Santa Clara, CA (US)

(72) Inventors: Prashant Majhi, San Jose, CA (US); Abhishek A. Sharma, Hillsboro, OR (US); Charles Kuo, Union City, CA (US); Brian S. Doyle, Portland, OR (US); Urusa Shahriar Alaan, Hillsboro, OR (US); Van H Le, Beaverton, OR (US); Elijah V. Karpov, Portland, OR (US); Kaan Oguz, Portland, OR (US); Arnab Sen Gupta, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 860 days.

(21) Appl. No.: 16/888,910

(22) Filed: Jun. 1, 2020

(65) Prior Publication Data
US 2021/0375873 A1    Dec. 2, 2021

(51) Int. Cl.
*H10B 12/00* (2023.01)
*H01L 25/065* (2023.01)

(52) U.S. Cl.
CPC ......... *H10B 12/30* (2023.02); *H01L 25/0657* (2013.01)

(58) Field of Classification Search
CPC .......................... H10B 12/30; H01L 25/0657
See application file for complete search history.

(56) References Cited

U.S. PATENT DOCUMENTS

| | | | | |
|---|---|---|---|---|
| 2009/0070721 | A1* | 3/2009 | Solomon | H01L 25/0657 716/118 |
| 2012/0250443 | A1* | 10/2012 | Saraswat | G06F 1/3275 365/226 |
| 2020/0411078 | A1* | 12/2020 | Sharma | H10B 12/315 |

FOREIGN PATENT DOCUMENTS

| | | | | |
|---|---|---|---|---|
| CN | 111357108 A | * | 6/2020 | ........... H01L 21/187 |
| WO | WO-0075793 A1 | * | 12/2000 | ......... G06F 12/0893 |
| WO | WO-2013095561 A1 | * | 6/2013 | ........... G06F 13/385 |

\* cited by examiner

*Primary Examiner* — Matthew E Warren
(74) *Attorney, Agent, or Firm* — Akona IP PC

(57) ABSTRACT

Embodiments may relate to a microelectronic package that includes a first plurality of memory cells of a first type coupled with a substrate. The microelectronic package may further include a second plurality of memory cells of a second type communicatively coupled with the substrate such that the first plurality of memory cells is between the substrate and the second plurality of memory cells. Other embodiments may be described or claimed.

20 Claims, 6 Drawing Sheets

MONOLITHIC MEMORY STACK

BACKGROUND

For future high-performance system-on-chip (SoC) architectures, there may be an increasing desire for high-bandwidth and high-density memory that is closely coupled with a processor such as a central processing unit (CPU) or a graphics processing unit (GPU).

DETAILED DESCRIPTION

Figure 1:
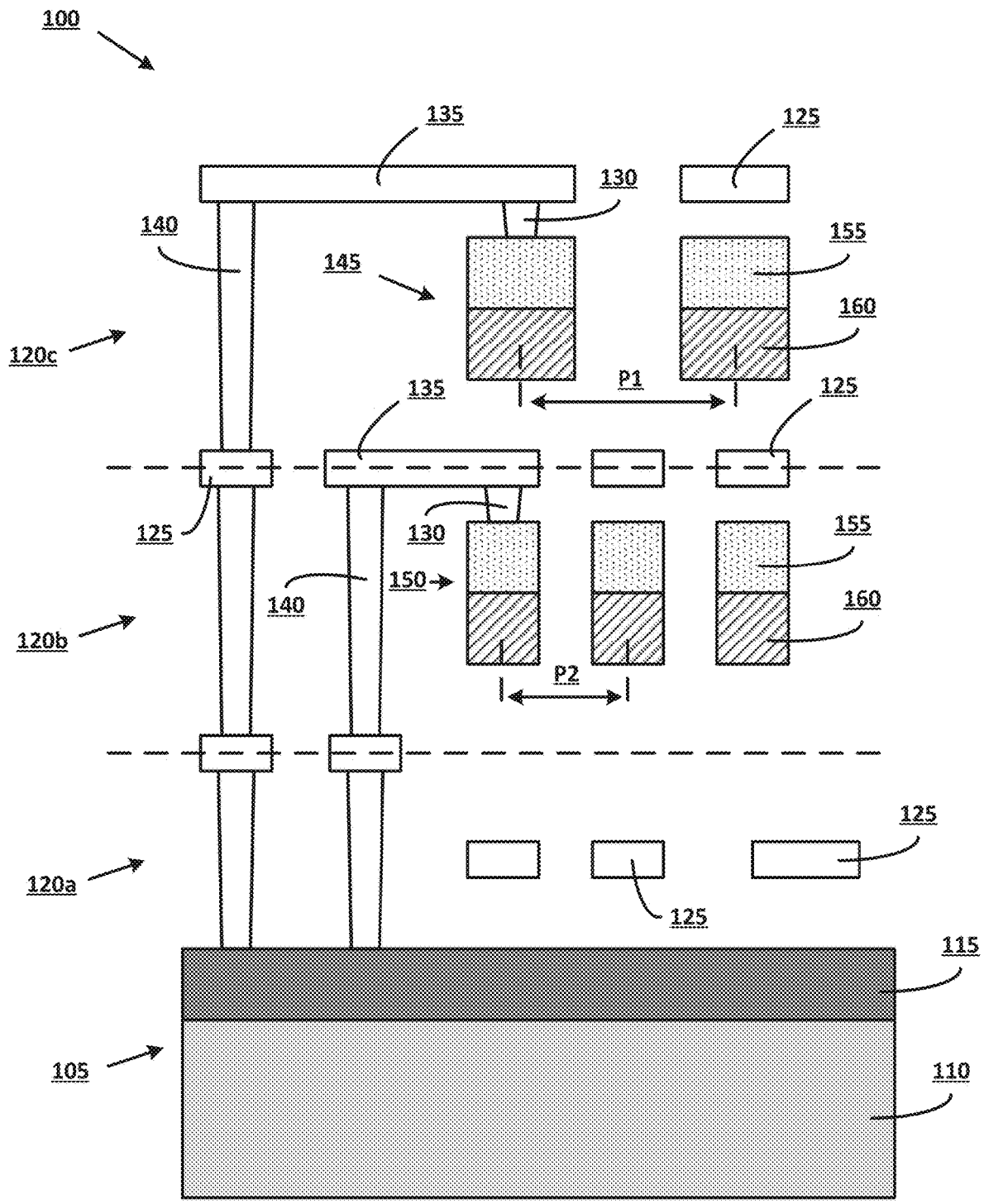
FIG. 1 depicts an example microelectronic package with a monolithic memory stack, in accordance with various embodiments.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature [[formed/deposited/disposed/etc.]] on a second feature," may mean that the first feature is formed/deposited/disposed/etc. over the feature layer, and at least a part of the first feature may be in direct contact (e.g., direct physical or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

Embodiments herein may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise. Additionally, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined, e.g., using scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

As noted, there may be a desire for high-bandwidth or high-density memory that is closely coupled with the CPU or GPU of an electronic device. To this end, dynamic random-access memory (DRAM) or embedded DRAM (eDRAM) may provide benefits. Specifically, DRAM may allow for increased memory density of a microelectronic package. eDRAM may provide improved latency or higher-bandwidth. However, in legacy microelectronic packages, DRAM or eDRAM memory may be processed on different wafers that are then integrated in complex packages to provide both high-bandwidth and controllable memory capacity, which be undesirable from a cost or performance standpoint.

Embodiments herein relate to microelectronic packages wherein DRAM and eDRAM is integrated in a monolithic stack within a wafer 3D stacked form. Embodiments may also share the complimentary metal-oxide-semiconductor (CMOS) periphery of the microelectronic package. As a result, embodiments may provide various advantages in terms of performance. For example, embodiments may have improved latency or bandwidth, higher density, etc. Embodiments may also be easier to manufacture, which may provide for reduced manufacturing cost. Finally, embodiments may generally have a reduced form factor compared to legacy microelectronic packages.

FIG. 1 depicts an example microelectronic package 100 with a monolithic memory stack, in accordance with various embodiments. It will be understood that FIG. 1, and other Figures herein, are intended as highly simplified depictions of various embodiments for the sake of discussion of concepts herein. To the extent that various elements are depicted, not each and every element is labeled for the sake of lack of clutter in the Figures. However, it may be assumed, unless expressly stated otherwise, that elements that appear identical to an enumerated and described element in terms of shape, size, positioning, or shading may share described characteristics of that enumerated element. Additionally, it will be noted that in real-world embodiments of the present disclosure, the various microelectronic packages may include additional active, passive, or conductive elements that are not depicted in the Figures. Additionally, although elements may be depicted herein with a specific size, shape, location, or number, it will be understood that such characteristics may vary in other embodiments. For example, other embodiments may have more or fewer DRAM cells, eDRAM cells, layers, etc. than are depicted herein.

The microelectronic package 100 may include a substrate 105 that includes a substrate material 110 and a CMOS layer 115. The substrate 105 may be, for example, considered to be a cored or coreless substrate. The substrate material 110 may be organic or inorganic and may be a material such as a build-up film or some other type of material. The substrate 105 may further include one or more conductive elements such as vias, pads, traces, microstrips, striplines, etc. The conductive elements may be internal to, or on the surface of, the substrate 105. Generally, the conductive elements may allow for the routing of signals through the substrate 105, or between elements that are coupled to the substrate 105. In some embodiments the substrate 105 may be, for example, a printed circuit board (PCB), an interposer, a motherboard, or some other type of substrate.

The CMOS layer 115 may be referred to as a CMOS under array (CuA). Generally, the CMOS layer may include a number of elements such as periphery transistors (not shown for the sake of simplicity of the Figure). The periphery transistors may be coupled with one or more of the various memory cells of the microelectronic package 100. Generally, the periphery transistors may be used to form circuits that assist in managing (i.e., writing to, or reading from) the memory cells, or communicatively coupling to a component such as a CPU or GPU of an electronic device of which the microelectronic package 100 is a part. In some embodiments, the CMOS layer 115 may be formed as a structure of the substrate 105, while in other embodiments the CMOS layer 115 may be formed separately from, and then subsequently attached to, the substrate material 110.

The microelectronic package 100 may further include a number of layers 120a, 120b, and 120c. It will be understood that in some embodiments, the various layers may not by physically distinguishable from one another. That is, the boundary between layers 120a and 120b may not be physically distinguishable. In other embodiments, the two or more of the layers 120a/120b/120c may be formed separately from one another such that they may be physically distinguishable from one another. It will also be understood that the demarcated separation of the various layers 120a/120b/120c indicated by the horizontal dashed line is intended for the sake of discussion only, and a skilled artisan may view the boundary between two or more of the layers to be at a different location than depicted herein.

The first layer 120a may include a number of conductive elements such as striplines, microstrips, traces, pads, etc. FIG. 1 in specific depicts a number of pads 125. The conductive elements may be formed of a conductive metal such as copper, gold, etc. Generally, the conductive elements may be configured to route electrical signals between various elements of the microelectronic package 100 as discussed above.

The second layer 120b may include a number of memory cells. Specifically, FIG. 1 depicts a number of DRAM cells 150. Respective ones of the DRAM cells 150 may include a capacitor 155 and a transistor 160. Although not specifically depicted herein, it will be understood that respective ones of the DRAM cells 150 may be communicatively coupled with a number of conductive elements that may be viewed as a bitline, a wordline, a power source, or some other conductive element. Typically, the DRAM cells 150 may have a memory capacity of between approximately 0.2 gigabytes (GB) to on the order of 10's of GBs (although in other embodiments the memory capacity may be higher or lower dependent on design needs, materials used, technological advancement, etc.). Typically, a DRAM cell 150 may include, as compared to an eDRAM cell or some other type of memory cell, a transistor and capacitor that is formed in an array defining how it may be programmed or read.

As may be seen, the DRAM cells 150 may have a pitch P2, which may refer to a lateral distance from the center of one of the DRAM cells 150 to another of the DRAM cells 150. The distance P2 may be between approximately 25 nanometers (nm) and approximately 100 nm. More specifically, in some embodiments the distance P2 may be approximately 50 nm.

The third layer 120c may likewise include a number of memory cells. Specifically, the third layer 120c may include a number of eDRAM cells 145 which may likewise include a capacitor 155 and a transistor 160. Similarly to the DRAM cells 150, it will be understood that respective ones of the eDRAM cells 145 may be communicatively coupled with a number of conductive elements that may be viewed as a bitline, a wordline, a power source, or some other conductive element. Typically, the eDRAM cells 145 may have a memory capacity of between approximately 0.05 GB and approximately 4 GB, although in other embodiments the memory capacity of an eDRAM cell 145 may be higher or lower. Typically, an eDRAM cell may have a structure similar to that of a DRAM cell, but with a different operating speed, voltage requirement, or operating power.

As may be seen, the eDRAM cells 145 may have a pitch P1, which may refer to a lateral distance from the center of one of the eDRAM cells 145 to another of the eDRAM cells 145. The distance P1 may be between approximately 50 nm and approximately 200 nm. More specifically, in some embodiments the distance P1 may be approximately 100 nm.

It will be noted that the second and third layers 120b/120c may include additional elements such as pads 125. Additionally, the second and third layers 120b/120c may include additional conductive elements which may communicatively couple various of the DRAM cells 150 or the eDRAM cells 145 to the substrate 105 and, more particularly, to the CMOS layer 115. Specifically, various of the layers 120b/120c may include a trace 135 that is coupled with a DRAM cell 150 or an eDRAM cell 145 by a via 130. Similarly to the pads 125 or other interconnects discussed herein, the trace(s) 135 or the via(s) 130 may be formed of a conductive material such as copper, gold, etc. The microelectronic package 100 may further include through mold vias (TMVs) 140 which may be communicatively coupled to the interconnects 135 and the CMOS layer 115, and allow for communication between various layers 120a/120b/120c of the microelectronic package 100. In some embodiments, the TMVs 140 may only extend through a single layer of the microelectronic package, and may couple with pads 125 at respective ones of the layers as depicted. In other embodiments, a single TMV 140 may extend through a plurality of the layers.

As previously noted, FIG. 1 is intended as a highly simplified depiction of a monolithic memory stack in accordance with embodiments herein. In some embodiments, the TMVs 140, interconnects 135, and vias 130 may be configured to be a bitline, a wordline, or a power source as described above. In some embodiments, the vias 130 may not be coupled with the capacitor 155 of the various memory cells as depicted, but rather may be additionally or alternatively coupled with the transistor 160. Generally, it will be understood that P1 may be greater than P2 in some embodiments because eDRAM may have a lower latency, and therefore require a higher performance transistor 160 with looser pitch and a less dense bit than the transistor 160 of a DRAM cell 150.

Additionally, it will be understood that although the eDRAM layer (i.e., layer 120c with the eDRAM cells 145) is depicted in the "top" layer of the microelectronic package 100, in other embodiments the eDRAM layer may be between the substrate 105 and the DRAM layer (i.e., layer 120b with the DRAM cells 150). That is, the DRAM layer may be on top of the eDRAM layer as oriented in FIG. 1. Additionally, in some embodiments the first layer 120a (i.e., the layer that is depicted as not including memory cells) may not be present. In some embodiments, additional layers such as additional DRAM layers or eDRAM layers may be present in various configurations. Other variations may be present in other embodiments.

Figure 2:
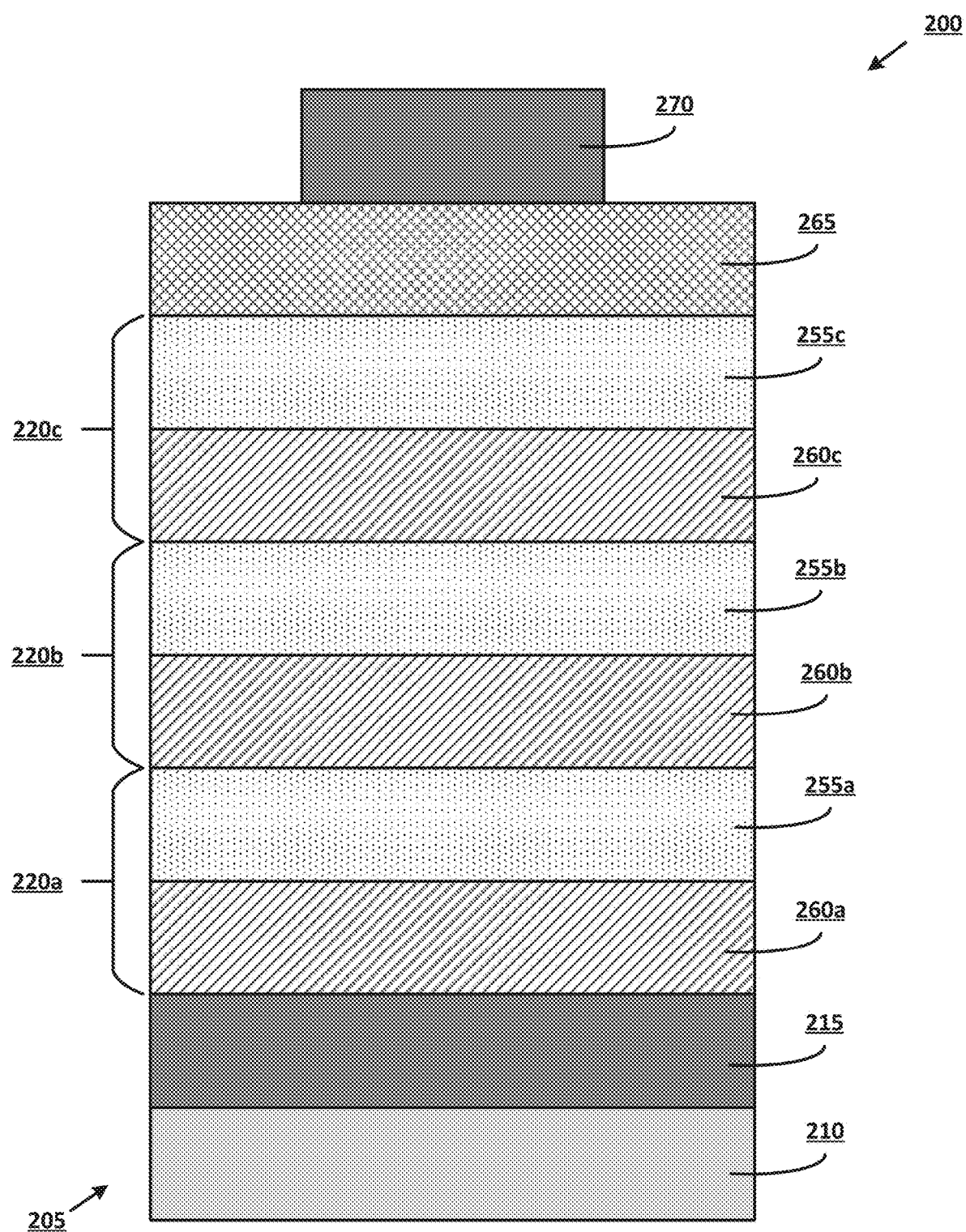
FIG. 2 depicts an alternative example microelectronic package with a monolithic memory stack, in accordance with various embodiments.
Figure 3:
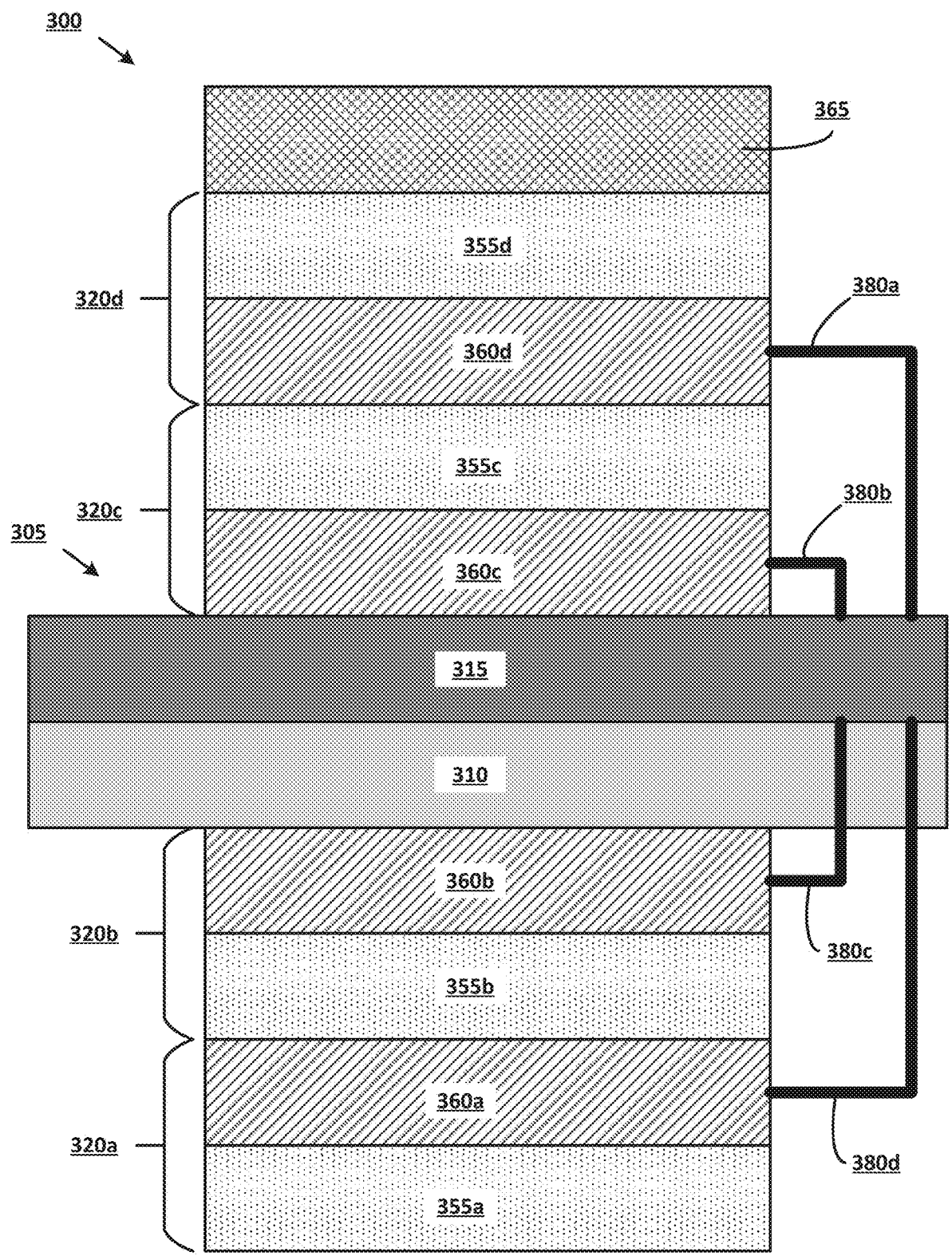
FIG. 3 depicts an alternative example microelectronic package with a monolithic memory stack, in accordance with various embodiments.

In some embodiments, in addition to the various above-described benefits, it may be desirable to further design the microelectronic package to provide benefits such as decreased cost, decreased cycle time, or decreased footprint. FIGS. 2 and 3 provide high-level depictions of example architectures which may provide various of the above-described benefits. Generally, it will be understood that FIGS. 2 and 3 are intended as very high-level depictions, and various elements such as conductive elements, active or passive elements, etc. may not be depicted in the FIG. 2 or 3. For example, FIG. 2 may depict a plurality of layers of memory cells. However, the specific capacitors or transistors, or various conductive elements such as traces, etc. may not be depicted. Additionally, distinct memory cells may not be depicted in the various layers. Finally, it will be understood that although various of the layers may be depicted as having generally the same z-height as one another, such depiction is for the sake of illustration and not intended to imply specific measurements with regard to z-height.

More specifically, FIG. 2 depicts an alternative example microelectronic package 200 with a monolithic memory stack, in accordance with various embodiments. The microelectronic package 200 may include a substrate 205 with a substrate material 210 and a CMOS layer 215, which may be respectively similar to substrate 105, substrate material 110, and CMOS layer 115.

The microelectronic package 200 may further include a number of layers 220a/220b/220c. Specifically, respective ones of the layers 220a/220b/220c may be similar to, for example, layers 120b or 120c of FIG. 1. Although not explicitly shown, the microelectronic package 200 may further include one or more layers that do not include a memory cells, such as layer 120a of FIG. 1. The layers 220a/220b/220c may be subdivided into layers of cell capacitors 255a/255b/255c and cell transistors 260a/260b/206c which may respectively include capacitors such as capacitors 155 and transistors such as transistors 160. Similarly to FIG. 1, the layers 220a/220b/220c may include memory cells such as DRAM cells 150 or eDRAM cells 145. The specific arrangement of which of the layers 220a/220b/220c includes DRAM or eDRAM cells may be dependent on factors such as design requirements, materials used, manufacturing processes used, etc.

It will be understood that, although the layers 220a/220b/220c are shown as having a same orientation of cell capacitors 255a/255b/255c and cell transistors 260a/260b/260c with respect to one another, in other embodiments one or more of the layers may be arranged differently. As one example, cell capacitors 255b may be adjacent to cell capacitors 255a, and cell transistors 260b may be adjacent to cell transistors 260c. Additionally, it will be understood that although only 3 layers are depicted in FIG. 2, other embodiments may have more or fewer layers.

The microelectronic package 200 may further include a backend interconnect layer 265. The backend interconnect layer may include a number of interconnects which may be used to communicatively or physically couple the monolithic memory stack to one or more additional elements such as an active die. The interconnect layer 265 may include one or more conductive elements such as pads, striplines, microstrips, traces, vias, etc. In some embodiments, the interconnect layer 265 may further include one or more active or passive die or elements (not shown for the sake of clarity of the Figure).

In some embodiments, the interconnect layer 265 may further include one or more interconnects which may serve to couple the memory stack (e.g., layers 220a/220b/220c) to a die such as CMOS die 270. The interconnects may be or include, for example, solder bumps, solder balls, elements of a ball grid array (BGA), elements of a pin grid array (PGA), elements of a solder grid array (SGA) or some other type of interconnect.

The CMOS die 270 may include one or more elements that are similar to those of CMOS layer 215. For example, the CMOS die 270 may include one or more transistors which may act as periphery transistors for memory cells of the various layers 220a/220b/220c. Although not explicitly shown in FIG. 2, the CMOS die 270 may be communicatively coupled with various of the memory cells (e.g., the capacitors or transistors thereof) by TMVs or through-silicon-vias (TSVs).

As may be seen, the microelectronic package of FIG. 2 may include a variety of benefits. For example, in legacy packages, the substrate 205 may have a greater footprint than that of the memory stack (e.g., layers 220a/220b/220c). In other words, the substrate 205 may extend laterally (e.g., from left to right as oriented in FIG. 2) beyond the memory stack. However, in embodiments herein, the excess extension of the substrate 205, and particularly the CMOS layer 215, may be removed and instead be implemented as CMOS die 270. This may, as a result, decrease the lateral footprint of the microelectronic package. It may also allow the CMOS die 270 to directly communicate with upper layers (e.g., layer 220c) of the microelectronic stack, which may increase performance. Finally, manufacture of the microelectronic package 200 may be more efficient based on the decreased footprint, and therefore the cost of manufacturing the packages 200 may be significantly lower than the cost of manufacture of legacy packages. Other benefits may likewise be apparent.

FIG. 3 depicts an alternative example microelectronic package 300 with a monolithic memory stack, in accordance with various embodiments. Generally, it will be recognized that FIG. 3 may share a similar level of abstraction with respect to various elements as described above with respect to FIG. 2. For example, specific memory cells, additional active/passive/conductive elements, etc. may not be depicted in FIG. 3. Rather, FIG. 3 is intended as a high-level abstraction for the sake of discussion of elements herein.

The microelectronic package 300 may include a substrate 305 that includes substrate material 310 and a CMOS layer 315, which may be respectively similar to substrate 205, substrate material 210, and CMOS layer 215. The microelectronic package 300 may further include a number of layers 320a/320b/320c/320d which may be similar to various of the layers 220a/220b/220c. Respective ones of the layers 320a/320b/320c/320d may include cell capacitors 355a/355b/355c/355d and cell transistors 360a/360b/360c/360d which may be respectively similar to one or more of cell capacitors 255a/255b/255c and cell transistors 260a/260b/260c. The microelectronic package 300 may further include an interconnect layer 365, which may be similar to interconnect layer 265.

As may be seen in FIG. 3, in some embodiments the microelectronic package 300 may be configured such that the substrate 305 is between various of the layers 320a/320b/320c/320d of the microelectronic package 300. In some embodiments, as may be seen, the layers 320a/320b/320c/320d may be inverted with respect to one another dependent on which side of the substrate 305 they are positioned. Specifically, layers 320a and 320b may be viewed as inverted with respect to layers 320c and 320d. However, it will be understood that this configuration is one example configuration, and various of the layers may be oriented differently than depicted in FIG. 3.

In some embodiments, the microelectronic package 300 may include a number of wirebonds 380a/380b/380c/380d. Typically, the wirebonds 380a/380b/380c/380d may be, or may include, conductive elements which may communicatively couple the various layers 320a/320b/320c/320d, and particularly the transistors 360a/360b/360c/360d with the substrate 305, and particularly the CMOS layer 315 of the substrate 305. It will be understood, however, that in various embodiments, wirebonds such as wirebonds 380a/380b/380c/380d may additionally or alternatively be coupled with one or more of the cell capacitors such as cell capacitors 355a/355b/355c/355d of various of the layers of the microelectronic package 300. In some embodiments, although the wirebonds 380a/380b/380c/380d are depicted as only being on the right side of the microelectronic package 300, in other embodiments the microelectronic package 300 may additionally or alternatively have wirebonds on the left side of the microelectronic package 300 (as oriented in FIG. 3). Additionally, in some embodiments one or more of the layers 320a/320b/320c/320d may additionally or alternatively be communicatively coupled with the substrate 305 (or the CMOS layer 315 thereof) by one or more TSVs or TMVs, or some other communicative coupling.

The microelectronic package 300 may exhibit a number of advantages over legacy microelectronic packages. Specifically, rather than making each of the layers of the microelectronic package 300 individually, the layers on "top" of the microelectronic package 300 (as oriented with respect to FIG. 3) may be manufactured concurrently with the layers on the "bottom" of the microelectronic package 300. The "top" or "bottom" layers may then be physically coupled with the substrate 305 subsequent to manufacture. In this way, because various of the layers may be manufactured generally concurrently with one another, the overall manufacture time (e.g., the "cycle time") of the microelectronic package 300 may be significantly reduced compared to the cycle time of a microelectronic package that utilized a legacy manufacturing process.

Figure 4:
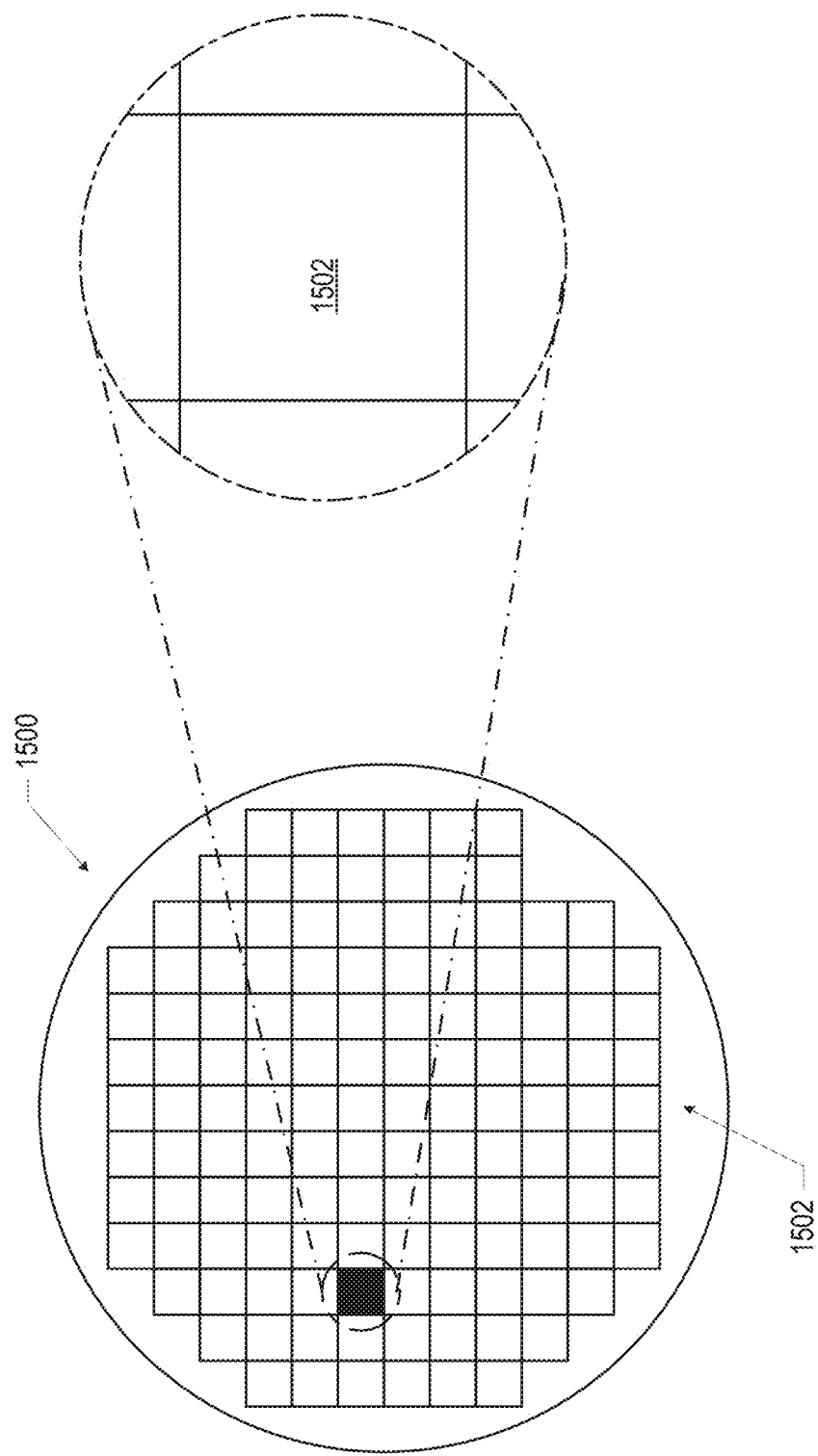
FIG. 4 is a top view of a wafer and dies that may include a monolithic memory stack, in accordance with various embodiments.

FIG. 4 is a top view of a wafer 1500 and dies 1502 that may include one or more monolithic memory stacks, or may be included in an IC package including one or more monolithic memory stacks in accordance with various embodiments. The wafer 1500 may be composed of semiconductor material and may include one or more dies 1502 having IC structures formed on a surface of the wafer 1500. Each of the dies 1502 may be a repeating unit of a semiconductor product that includes a suitable IC. After the fabrication of the semiconductor product is complete, the wafer 1500 may undergo a singulation process in which the dies 1502 are separated from one another to provide discrete "chips" of the semiconductor product. The die 1502 may include one or more monolithic memory stacks, one or more transistors or supporting circuitry to route electrical signals to the transistors, or some other IC component. In some embodiments, the wafer 1500 or the die 1502 may include a memory device (e.g., a random-access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 6) or other logic that is configured to store information in the memory devices or execute instructions stored in the memory array.

Figure 5:
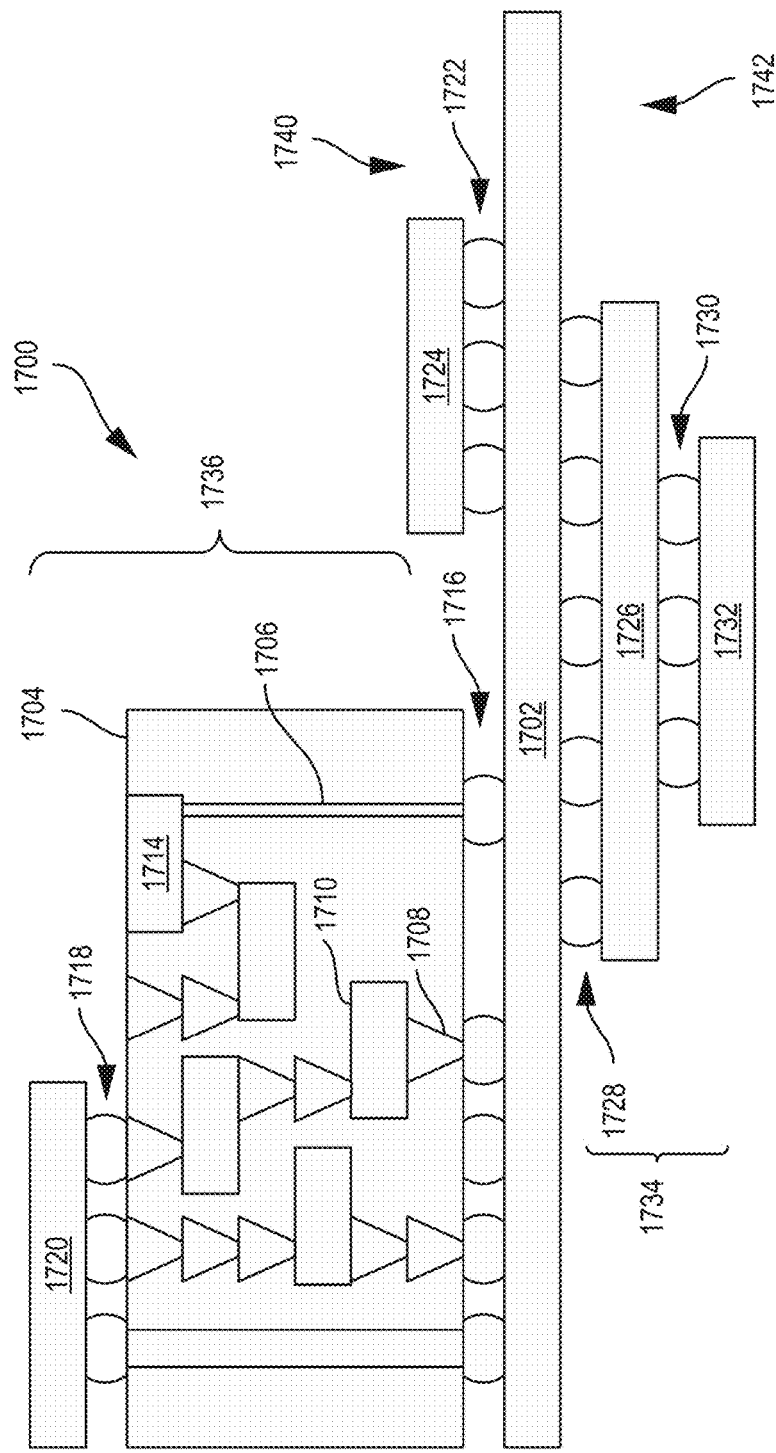
FIG. 5 is a side, cross-sectional view of an integrated circuit (IC) device assembly that may include a monolithic memory stack, in accordance with various embodiments.

FIG. 5 is a side, cross-sectional view of an IC device assembly 1700 that may include one or more IC packages or other electronic components (e.g., a die) including one or more monolithic memory stacks, in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 5 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 5), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 5, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 4), an IC device, or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 5, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to TSVs 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art. In some embodiments, the package interposer 1704 may include one or more of the microelectronic packages discussed or depicted herein.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 5 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 6:
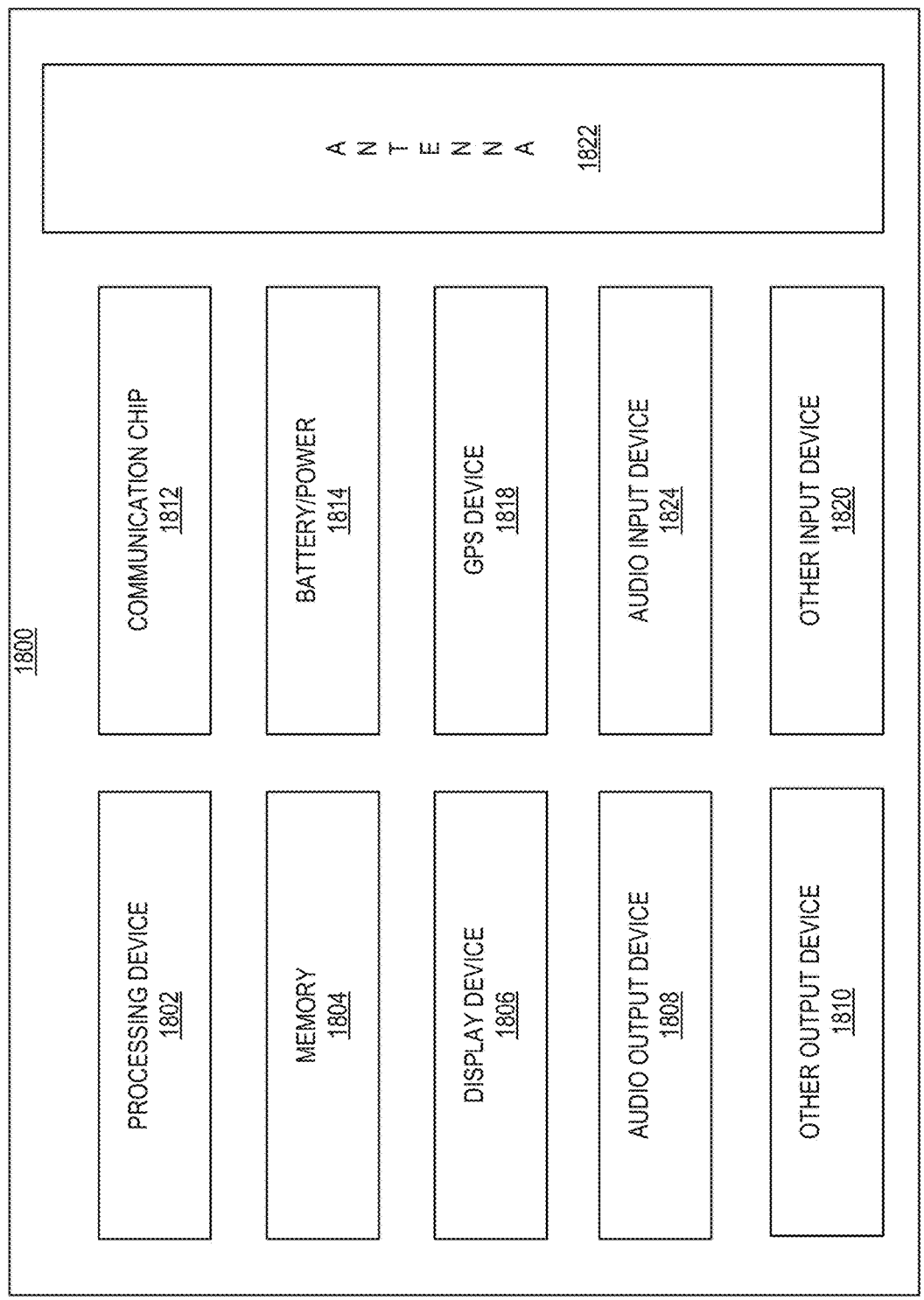
FIG. 6 is a block diagram of an example electrical device that may include a monolithic memory stack, in accordance with various embodiments.

FIG. 6 is a block diagram of an example electrical device 1800 that may include one or more microelectronic packages with a monolithic memory stack, in accordance with any of the embodiments disclosed herein. For example, any suitable ones of the components of the electrical device 1800 may include one or more of the IC device assemblies 1700, IC packages, IC devices, or dies 1502 disclosed herein. A number of components are illustrated in FIG. X3 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single SoC die.

Additionally, in various embodiments, the electrical device 1800 may not include one or more of the components illustrated in FIG. 6, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific ICs (ASICs), CPUs, GPUs, cryptoprocessors (specialized processors that execute cryptographic algorithms within hardware), server processors, or any other suitable processing devices. The electrical device 1800 may include a memory 1804, which may itself include one or more memory devices such as volatile memory (e.g., DRAM), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include eDRAM or spin transfer torque magnetic RAM (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include another output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include another input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

Examples of Various Embodiments

Example 1 includes a microelectronic package comprising: a substrate; a plurality of DRAM cells communicatively coupled with a face of the substrate; and a plurality of eDRAM cells communicatively coupled with a face of the substrate, wherein the plurality of DRAM cells is between the substrate and the plurality of eDRAM cells.

Example 2 includes the microelectronic package of example 1, wherein the substrate includes a periphery transistor that is communicatively coupled with a DRAM cell of the plurality of DRAM cells or an eDRAM cell of the plurality of eDRAM cells.

Example 3 includes the microelectronic package of example 1, wherein the DRAM cells are communicatively coupled with the face of the substrate by interconnects with a pitch between 25 nanometers (nm) and 100 nm.

Example 4 includes the microelectronic package of example 1, wherein the eDRAM cells are communicatively coupled with the face of the substrate by interconnects with a pitch between 50 nanometers (nm) and 200 nm.

Example 5 includes the microelectronic package of any of examples 1-4, wherein a DRAM cell of the plurality of DRAM cells includes a capacitor and a transistor.

Example 6 includes the microelectronic package of any of examples 1-4, wherein an eDRAM cell of the plurality of eDRAM cells includes a capacitor and a transistor.

Example 7 includes the microelectronic package of any of examples 1-4, further comprising a second plurality of DRAM cells or eDRAM cells communicatively coupled with the substrate, wherein the plurality of eDRAM cells is between the second plurality of DRAM cells or eDRAM cells and the substrate.

Example 8 includes a microelectronic package comprising: a substrate with a first CMOS layer; a first plurality of memory cells coupled with the substrate; a second plurality of memory cells communicatively coupled with the substrate, wherein the first plurality of memory cells is between the second plurality of memory cells and the substrate; and a second CMOS layer communicatively coupled with the second plurality of memory cells, wherein the second plurality of memory cells are between the second CMOS layer and the first plurality of memory cells.

Example 9 includes the microelectronic package of example 8, wherein the substrate has a same lateral footprint as the first plurality of memory cells, wherein the lateral footprint is measured in a direction parallel to a face of the substrate to which the first plurality of memory cells is coupled.

Example 10 includes the microelectronic package of example 8, wherein the second CMOS layer includes a periphery transistor of a memory cell of the first or second plurality of memory cells.

Example 11 includes the microelectronic package of any of examples 8-10, wherein the first plurality of memory cells includes a plurality of DRAM cells.

Example 12 includes the microelectronic package of any of examples 8-10, wherein the second plurality of memory cells are eDRAM cells.

Example 13 includes the microelectronic package of any of examples 8-10, further comprising wherein the second CMOS layer is further communicatively coupled with the first plurality of memory cells.

Example 14 includes the microelectronic package of any of examples 8-10, further comprising a third plurality of memory cells communicatively coupled with the substrate, wherein the third plurality of memory cells is between the first and second plurality of memory cells.

Example 15 includes a microelectronic package comprising: a substrate with a CMOS layer, wherein the substrate includes a first side and a second side opposite the first side; a first plurality of memory cells communicatively coupled with the first side of the substrate; and a second plurality of memory cells communicatively coupled with the second side of the substrate; wherein the substrate is between the first and second plurality of memory cells.

Example 16 includes the microelectronic package of example 15, wherein the first plurality of memory cells is a plurality of DRAM cells or a plurality of eDRAM cells.

Example 17 includes the microelectronic package of example 15, further comprising a third plurality of memory cells communicatively coupled with the substrate, wherein the first plurality of memory cells is between the substrate and the third plurality of memory cells.

Example 18 includes the microelectronic package of example 17, wherein the first plurality of memory cells is a plurality of DRAM cells and the third plurality of memory cells is a plurality of eDRAM cells.

Example 19 includes the microelectronic package of any of examples 15-18, further comprising a backend interconnect coupled with a memory cell of the first plurality of memory cells, wherein the memory cell is between the backend interconnect and the substrate.

Example 20 includes the microelectronic package of any of examples 15-18, wherein a memory cell of the first plurality of memory cells includes a transistor and a capacitor, and wherein the transistor is between the capacitor and the substrate.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

The invention claimed is:

1. A microelectronic package, comprising:
a substrate;
a plurality of dynamic random-access memory (DRAM) cells communicatively coupled with a face of the substrate; and
a plurality of embedded DRAM (eDRAM) cells communicatively coupled with a face of the substrate, wherein the plurality of DRAM cells is between the substrate and the plurality of eDRAM cells, and wherein a pitch of the eDRAM cells is greater than a pitch of the DRAM cells.

2. The microelectronic package of claim 1, wherein the substrate includes a periphery transistor that is communicatively coupled with a DRAM cell of the plurality of DRAM cells or an eDRAM cell of the plurality of eDRAM cells.

3. The microelectronic package of claim 1, wherein the DRAM cells are communicatively coupled with the face of the substrate by interconnects, and wherein the pitch of the DRAM cells is between 25 nanometers (nm) and 100 nm.

4. The microelectronic package of claim 1, wherein the eDRAM cells are communicatively coupled with the face of the substrate by interconnects, and wherein the pitch of the eDRAM cells is between 50 nanometers (nm) and 200 nm.

5. The microelectronic package of claim 1, wherein a DRAM cell of the plurality of DRAM cells includes a capacitor and a transistor.

6. The microelectronic package of claim 1, wherein an eDRAM cell of the plurality of eDRAM cells includes a capacitor and a transistor.

7. The microelectronic package of claim 1, further comprising a second plurality of DRAM cells or eDRAM cells communicatively coupled with the substrate, wherein the plurality of eDRAM cells is between the second plurality of DRAM cells or eDRAM cells and the substrate.

8. A microelectronic package, comprising:
a substrate with a first complementary metal-oxide-semiconductor (CMOS) layer;
a first plurality of memory cells coupled with the substrate;
a second plurality of memory cells communicatively coupled with the substrate, wherein the first plurality of memory cells is between the second plurality of memory cells and the substrate; and
a second CMOS layer communicatively coupled with the second plurality of memory cells, wherein the second plurality of memory cells are between the second CMOS layer and the first plurality of memory cells, and wherein a pitch of the first plurality of memory cells is greater than a pitch of the second plurality of memory cells.

9. The microelectronic package of claim 8, wherein a lateral footprint of the substrate is same as a lateral footprint of the first plurality of memory cells.

10. The microelectronic package of claim 8, wherein the second CMOS layer includes a periphery transistor of a memory cell of the first or second plurality of memory cells.

11. The microelectronic package of claim 8, wherein the first plurality of memory cells includes a plurality of dynamic random-access memory (DRAM) cells.

12. The microelectronic package of claim 8, wherein the second plurality of memory cells are embedded dynamic random-access memory (eDRAM) cells.

13. The microelectronic package of claim 8, further comprising wherein the second CMOS layer is further communicatively coupled with the first plurality of memory cells.

14. The microelectronic package of claim 8, further comprising a third plurality of memory cells communicatively coupled with the substrate, wherein the third plurality of memory cells is between the first and second plurality of memory cells.

15. The microelectronic package of claim 1, wherein:
an individual DRAM cell of the plurality of DRAM cells includes a capacitor and a transistor,
transistors of multiple individual DRAM cells of the plurality of DRAM cells are arranged in a first layer over the substrate, and
capacitors of multiple individual DRAM cells of the plurality of DRAM cells are arranged in a second layer over the substrate.

16. The microelectronic package of claim 15, wherein the first layer is closer to the substrate than the second layer.

17. The microelectronic package of claim 15, wherein:
an individual eDRAM cell of the plurality of eDRAM cells includes a further capacitor and a further transistor,
further transistors of multiple individual eDRAM cells of the plurality of eDRAM cells are arranged in a third layer over the substrate, and
further capacitors of multiple individual eDRAM cells of the plurality of eDRAM cells are arranged in a fourth layer over the substrate.

18. The microelectronic package of claim 17, wherein the first layer is closer to the substrate than the second layer, the second layer is closer to the substrate than the third layer, and the third layer is closer to the substrate than the fourth layer.

19. An integrated circuit (IC) device assembly, comprising:
a microelectronic package; and
a further component coupled to the microelectronic package,
wherein the microelectronic package includes:
a substrate with a first complementary metal-oxide-semiconductor (CMOS) layer,
a first plurality of memory cells coupled with the substrate,
a second plurality of memory cells communicatively coupled with the substrate, wherein the first plurality of memory cells is between the second plurality of memory cells and the substrate, and
a second CMOS layer communicatively coupled with the second plurality of memory cells, wherein the second plurality of memory cells are between the second CMOS layer and the first plurality of memory cells, and wherein a pitch of the first plurality of memory cells is greater than a pitch of the second plurality of memory cells.

20. The IC device assembly of claim 19, wherein the further component is a circuit board or an interposer.

* * * * *

UNITED STATES PATENT AND TRADEMARK OFFICE
CERTIFICATE OF CORRECTION

| | |
|---|---|
| PATENT NO. | : 12,058,847 B2 |
| APPLICATION NO. | : 16/888910 |
| DATED | : August 6, 2024 |
| INVENTOR(S) | : Prashant Majhi et al. |

It is certified that error appears in the above-identified patent and that said Letters Patent is hereby corrected as shown below:

On the Title Page

In Item (72), under "Inventors", in Column 1, Line 6, delete "Van H le," and insert -- Van H. Le, --, therefor.

In the Claims

In Column 14, Claim 5, Line 57, delete "wherein a" and insert -- wherein the --, therefor.

In Column 14, Claim 6, Line 60, delete "wherein an" and insert -- wherein the --, therefor.

Signed and Sealed this
Seventeenth Day of September, 2024

Katherine Kelly Vidal
*Director of the United States Patent and Trademark Office*